(12) United States Patent
Watanabe

(10) Patent No.: US 7,558,998 B2
(45) Date of Patent: Jul. 7, 2009

(54) SEMICONDUCTOR APPARATUS AND CLOCK GENERATION UNIT

(75) Inventor: Naotake Watanabe, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 204 days.

(21) Appl. No.: 11/297,321

(22) Filed: Dec. 9, 2005

(65) Prior Publication Data

US 2006/0156119 A1 Jul. 13, 2006

(30) Foreign Application Priority Data

Dec. 17, 2004 (JP) .............................. 2004-365999

(51) Int. Cl.
*G01R 31/317* (2006.01)
*G01R 31/40* (2006.01)
(52) U.S. Cl. .................. 714/731; 714/726; 714/744
(58) Field of Classification Search .................. None
See application file for complete search history.

(56) References Cited

U.S. PATENT DOCUMENTS 5,528,638 A * 6/1996 Rajivan ....................... 375/376
6,084,453 A * 7/2000 Fuse et al. .................... 327/176
6,560,147 B2 * 5/2003 Yoshiyama ............. 365/189.05
2001/0055357 A1 * 12/2001 Chen ........................... 375/376
2005/0237836 A1 * 10/2005 Fang et al. ................... 365/222

FOREIGN PATENT DOCUMENTS

JP       6-242188       9/1994

* cited by examiner

*Primary Examiner*—Cynthia Britt
*Assistant Examiner*—Dipakkumar Gandhi
(74) *Attorney, Agent, or Firm*—McGinn IP Law Group, PLLC

(57) ABSTRACT

A semiconductor apparatus generates a clock signal used for scan test on an internal circuit of the semiconductor apparatus. The semiconductor apparatus includes a scan chain for performing input and output of data in the internal circuit, a clock generator for generating a launch clock signal for sending data to the internal circuit and a capture clock signal for capturing data from the internal circuit. The launch clock signal and the capture clock signal are generated based on a plurality of clock signals having different phases, and a pulse width of the plurality of clock signals is smaller than half of a cycle of the plurality of clock signals.

20 Claims, 4 Drawing Sheets

SEMICONDUCTOR APPARATUS AND CLOCK GENERATION UNIT

BACKGROUND OF THE INVENTION

1. Field of the Invention

The present invention relates to a semiconductor apparatus and a clock generation unit.

2. Description of Related Art

A semiconductor apparatus that has a circuit to generate a clock for testing an internal circuit of the semiconductor apparatus is described in Japanese Unexamined Patent Publication No. 6-242188 (Kitaguchi et al.) in FIGS. 1 and 2, paragraphs 0020 and 0029 to 0036. This semiconductor apparatus has an Exclusive-OR gate that generates a clock signal at a higher frequency than a plurality of input test clocks based on a phase difference of these test clocks and outputs it to the internal circuit. This semiconductor apparatus allows testing at a higher clock speed than the actual operation of the semiconductor apparatus even with an IC tester.

A tester is used to test a semiconductor apparatus. However, there is a limit to a clock speed which a tester can supply, and it has been unable for a tester to supply a clock of a higher speed than the actual operation speed of a semiconductor apparatus. Kitaguchi et al. teaches a technique for such a tester. The technique supplies two clocks with different phases from a tester. Using a phase difference between the two clocks, it supplies a clock at a higher frequency than a clock that is generated by the tester to an internal circuit of a semiconductor apparatus.

However, the technique taught by Kitaguchi et al. can supply a clock at a frequency that is only up to double the frequency of a clock supplied from the tester. It thus fails to supply a high speed clock that is used for scan test or the like.

It is possible to supply a clock at a frequency of N times higher than a clock frequency supplied from a tester as a clock for operating test to an internal circuit by placing a N-multiply PLL (N>2) in a semiconductor apparatus allows. However, since the multiply PLL generally occupies a large area, it causes an increase in the costs of a semiconductor apparatus.

SUMMARY OF THE INVENTION

According to an aspect of the present invention, there is provided a semiconductor apparatus for generating a clock signal used for scan test on an internal circuit of the semiconductor apparatus, which includes a scan chain performing input and output of data in the internal circuit, a clock generator generating a launch clock signal for sending data to the internal circuit and a capture clock signal for capturing data from the internal circuit, wherein the launch clock signal and the capture clock signal are generated based on a plurality of clock signals having different phases, and a pulse width of the plurality of clock signals is smaller than half of a cycle of the plurality of clock signals.

Since this configuration has the clock generation unit that generates a launch clock signal for sending data to the internal circuit and a capture clock signal for capturing data from the internal circuit, in which the launch clock signal and the capture clock signal are generated based on a plurality of clock signals having different phases and the pulse width of the plurality of clock signals is smaller than half of the cycle of the plurality of clock signals, it is possible to generate a clock signal at a high frequency that is suitable for scan test on an internal circuit of a semiconductor apparatus easily with a small scale circuit.

BRIEF DESCRIPTION OF THE DRAWINGS

The above and other objects, advantages and features of the present invention will be more apparent from the following description taken in conjunction with the accompanying drawings, in which.

PREFERRED EMBODIMENT OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

The configuration of a scan chain that is incorporated into a semiconductor apparatus according to a first embodiment of the present invention is described hereinafter with reference to the drawings.

Figure 1:
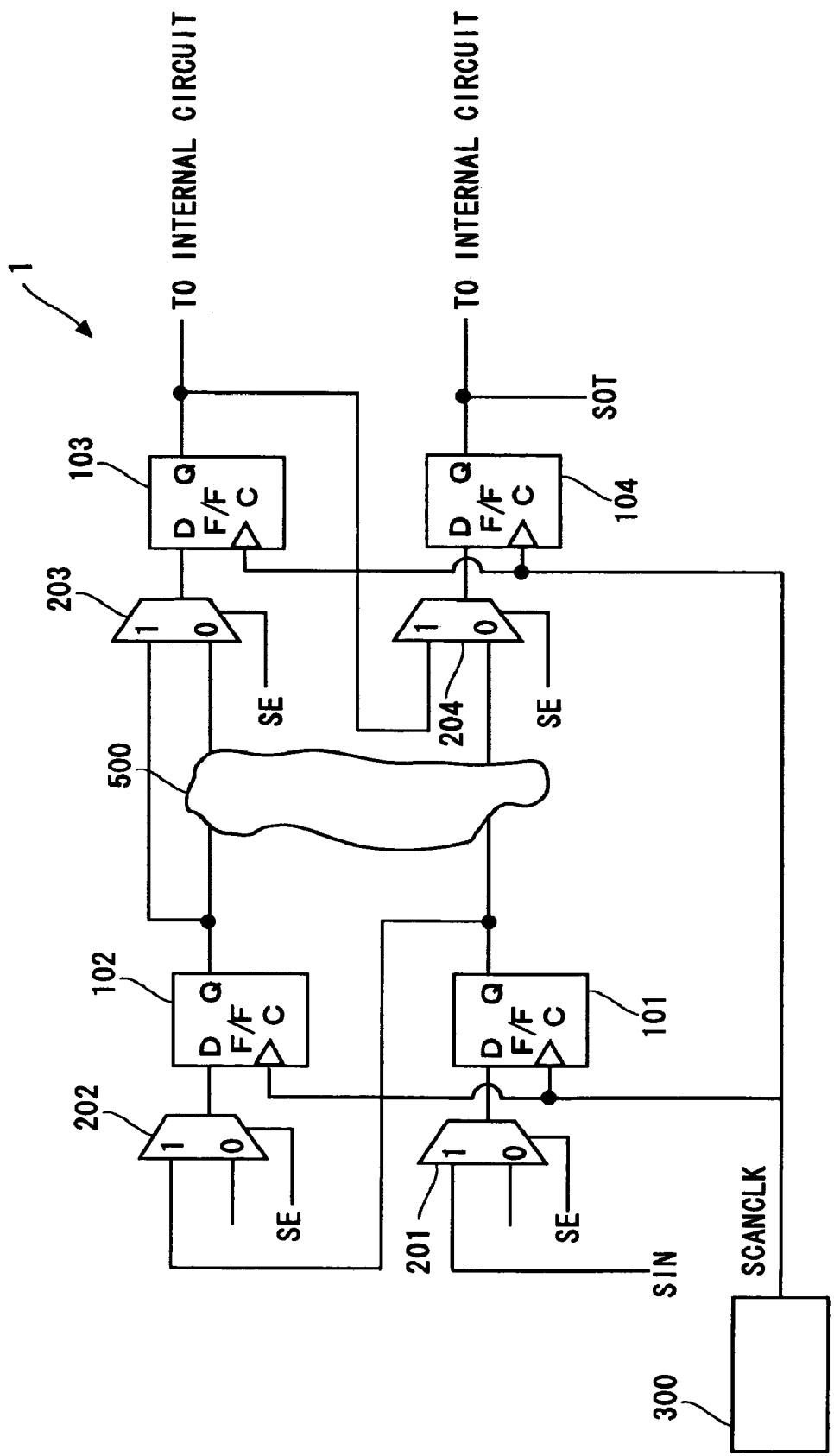
FIG. 1 is a view showing the configuration of a scan chain that is incorporated into a semiconductor apparatus according to a first embodiment of the present invention.

FIG. 1 is a view showing the configuration of a scan chain incorporated into a semiconductor apparatus according to the first embodiment of the present invention.

A scan chain 1 includes flip-flops (hereinafter referred to as F/Fs) 101, 102, 103 and 104 that serve as registers, and selectors 201, 202, 203 and 204. Though an actual scan chain includes a large number of F/Fs and selectors, it is assumed herein for convenience that the scan chain has four F/Fs and four selectors.

The scan chain 1 performs scan test on an internal circuit 500 of the semiconductor apparatus.

The F/Fs 101 to 104 each has a clock input terminal C, a data input terminal D, and a data output terminal Q.

The clock input terminal C of each F/F 101 to 104 receives a scan clock signal SCANCLK that is output from a high speed clock signal generation unit 300, which is described later. The data output terminal Q of the F/F 101 is connected to the data input terminal "1" of the selector 202 and the internal circuit 500. The data output terminal Q of the F/F 102 is connected to the data input terminal "1" of the selector 203 and the internal circuit 500. The data output terminal Q of the F/F 103 is connected to the data input terminal "1" of the selector 204 and an internal circuit (not shown) that is different from the internal circuit 500. The data output terminal Q of the F/F 104 is connected to a serial out SOT through which scan test data is output and an internal circuit (not shown) that is different from the internal circuit 500.

The selectors 201 to 204 each have two data input terminals, one data output terminal, and an input terminal of a scan enable signal SE. The data input terminals of the selectors 201 to 204 are a terminal "0" and a terminal "1".

The scan enable signal SE is a signal to switch between shift mode and capture mode. A mode is switched to the shift mode if the scan enable signal SE is HIGH level (hereinafter referred to as "H level") and switched to the capture mode if it is LOW level (hereinafter referred to as "L level").

The shift mode is a mode to send data sequentially and serially to a plurality of F/Fs that form the scan chain in synchronization with a predetermined clock signal.

The capture mode is a mode to send data from a plurality of F/Fs to an internal circuit of a semiconductor apparatus in synchronization with a launch clock signal LAUNCH CLK and capture data in parallel from the internal circuit of the semiconductor apparatus into the plurality of F/Fs in synchronization with a capture clock signal CAPTURE CLK.

The input terminals "0" of the selectors 201 and 202 are connected to an internal circuit (not shown) that is different from the internal circuit 500 nor the internal circuit (not shown) connected to the data output terminal Q of the F/F 103. The data output terminals of the selectors 201 to 204 are connected to the data input terminals D of the F/Fs 101 to 104, respectively.

The data input terminal "1" of the selector 201 is connected to a serial in SIN through which test data for scan test is input.

The internal configuration of the high speed clock signal generation unit 300 shown in FIG. 1 is described herein.

Figure 2:
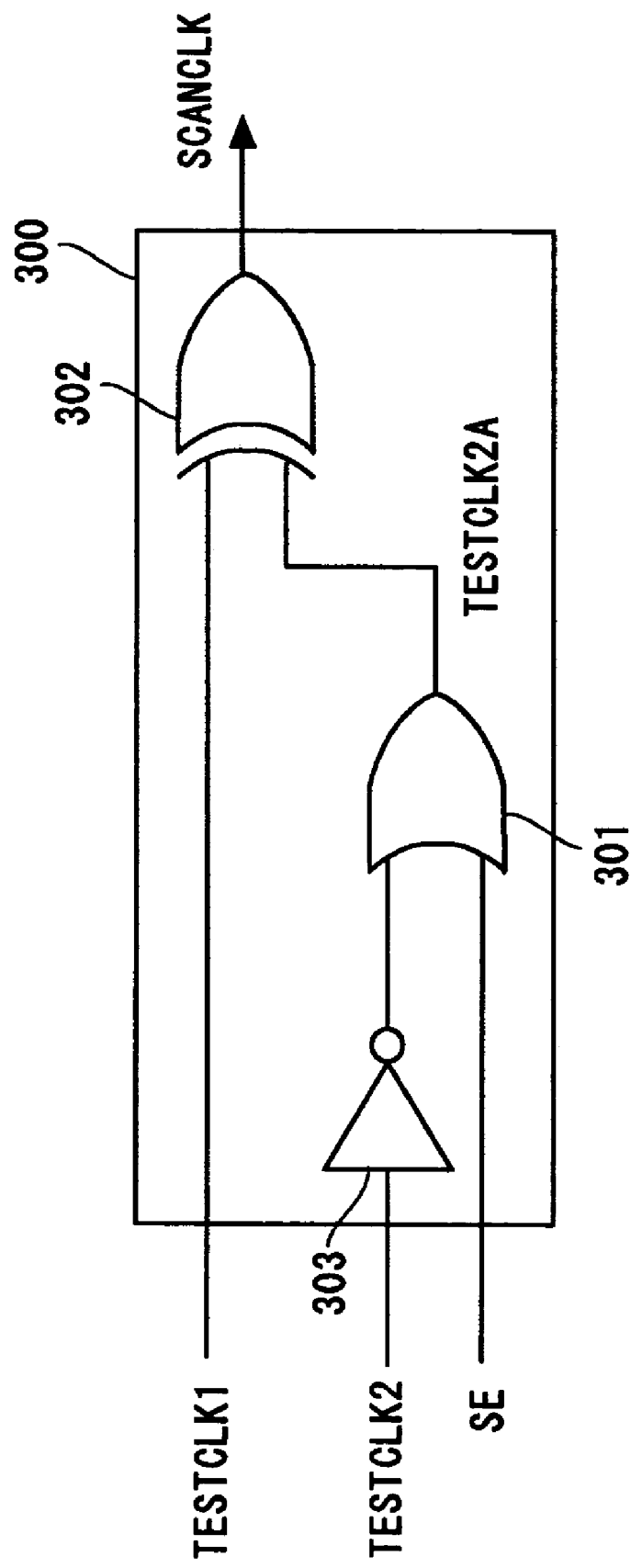
FIG. 2 is a view showing the internal configuration of a high speed clock signal generation unit according to the first embodiment of the present invention.

FIG. 2 is a view showing the internal configuration of the high speed clock signal generation unit according to the first embodiment of the invention.

The high speed clock signal generation unit 300 is composed of a combination of a plurality of logic circuits. It includes an OR circuit 301, an EXCLUSIVE-OR circuit (hereinafter referred to as the "EX-OR" circuit) 302, and an inverter 303.

TESTCLK 1 and 2 are test clock signals that are output from a tester unit (not shown). TESTCLK 1 and TESTCLK 2 have different phases from each other. A normal tester unit can adjust variation in phase up to about 0.1 ns, for example.

The inverter 303 inverts an input test clock signal TESTCLK 2 and outputs the inverted clock signal to the OR circuit 301.

One input terminal of the OR circuit 301 is connected to the output terminal of the inverter 303, and the other input terminal receives a scan enable signal SE. The output terminal of the OR circuit 301 is connected to the input terminal of the EX-OR circuit 302. The OR circuit 301 implements logical OR operation on an output signal from the inverter 303 and an input scan enable signal SE and outputs a clock signal TESTCLK 2A obtained by the OR operation to the EX-OR circuit 302.

One input terminal of the EX-OR circuit 302 receives a test clock signal TESTCLK 1, and the other input terminal of the EX-OR circuit 302 is connected to the output terminal of the OR circuit 301. The output terminal of the EX-OR circuit 302 is connected to the clock terminals C of the F/Fs 101 to 104. The EX-OR circuit 302 implements logical EXCLUSIVE-OR operation on the input test clock TESTCLK 1 and an output signal TESTCLK 2A from the OR circuit 301 and outputs a clock signal obtained by the EXCLUSIVE-OR operation to the clock terminals C of the F/Fs 101 to 104.

A scan clock signal SCANCLK contains a launch clock signal LAUNCH CLK for sending test data to the internal circuit 500 and a capture clock signal CAPTURE CLK for capturing data from the internal circuit 500 during the capture mode. The launch clock signal LAUNCH CLK and the capture clock signal CAPTURE CLK are generated based on a plurality of clock signals TESTCLK 1 and 2 having different phases by a clock generator or the high speed clock signal generation unit 300 as a clock generation unit.

A process for scan test on the scan chain 1 is described hereinafter with reference to the drawings.

Figure 3:
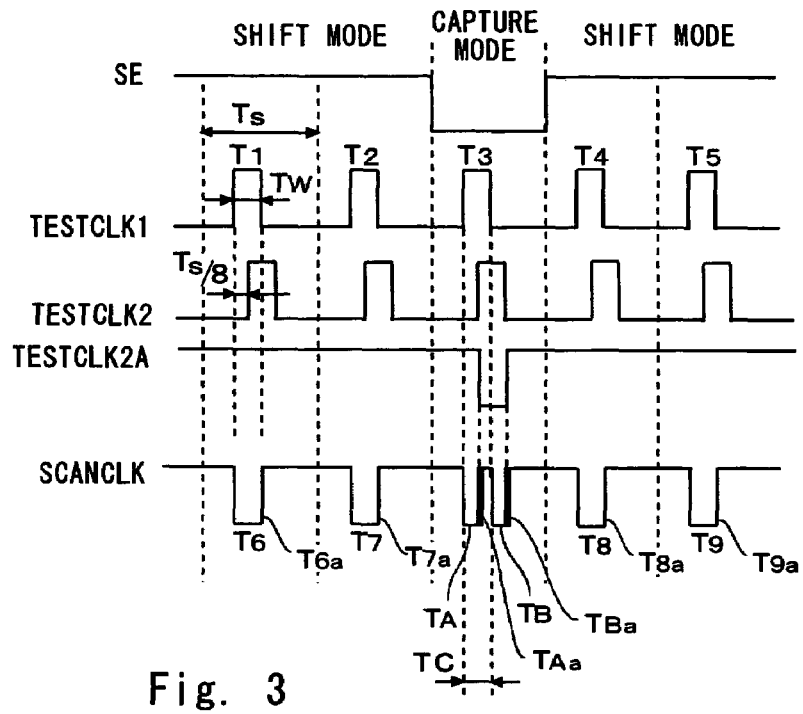
FIG. 3 is a view showing a timing chart of each signal in the high speed clock signal generation unit according to the first embodiment of the present invention.

FIG. 3 is a timing chart of each signal of a high speed clock signal generation unit according to a first embodiment of the present invention.

FIG. 3 shows a scan enable signal SE, test clock signals TESTCLK 1 and TESTCLK 2, an output signal TESTCLK 2A of the OR circuit 301, and a scan clock signal SCANCLK.

A process of generating a scan clock signal SCANCLK in the high speed clock signal generation unit 300 shown in FIGS. 1 and 2 is described herein.

As shown in FIG. 3, the test clock signals TESTCLK 1 and 2 that are output from a tester unit (not shown) have a clock cycle $T_S$, a clock pulse width $T_W = T_S/4$, and a duty ratio 25%, for example. Each pulse of the test clock signal TESTCLK 2 is input with a delay of $T_S/8$ with respect to the pulses $T_1$, $T_2$, $T_3$, $T_4$, and $T_5$ of the test clock signal TESTCLK 1.

During the shift mode, the scan enable signal SE is always H level and the output signal TESTCLK 2A of the OR circuit 301 is also always H level as shown in FIG. 3. Thus, the pulses $T_6$, $T_7$, $T_8$ and $T_9$ of the scan clock signal SCANCLK are rectangular wave pulses that are inversion of the pulses $T_1$, $T_2$, $T_4$ and $T_5$ of the test clock signal TESTCLK 1. Therefore, the scan clock signal SCANCLK has a clock cycle $T_S$, and a clock pulse width $T_S = 3*T_S/4$ during the shift mode.

Then, during the capture mode, the scan enable signal SE becomes L level for one clock cycle $T_S$, and the output signal TESTCLK 2A of the OR circuit 301 is an inverted signal of the test clock signal TESTCLK 2.

Thus, the first pulse $T_A$ of the scan clock signal SCANCLK falls at the same time as the rise of the pulse $T_3$ of the test clock signal TESTCLK 1 and rises at a clock edge $T_{Aa}$ at the same time as the rise of the test clock signal TESTCLK 2 that occurs after $T_S/8$. Further, the second pulse $T_B$ of the scan clock signal SCANCLK falls at the same time as the fall of the pulse $T_3$ and rises at a clock edge $T_{Ba}$ at the same time as the fall of the test clock signal TESTCLK 2 that occurs after $T_S/8$.

The cycle of the scan clock signal SCANCLK is determined by the pulse width $T_W$ of the test clock signals TESTCLK 1 and TESTCLK 2. If the pulse width $T_W$ of the test clock signals TESTCLK 1 and TESTCLK 2 is smaller than half of the clock cycle $T_S$ of the test clock signals TESTCLK 1 and TESTCLK 2, the cycle $T_C$ of the scan clock signal SCANCLK is smaller than half of the cycle of the test clock signals TESTCLK 1 and TESTCLK 2.

As shown in FIG. 3, the high speed clock signal generation unit 300 of the first embodiment of the invention sets the pulse width $T_W$ of the test clock signals TESTCLK 1 and TESTCLK 2 to ¼, which is smaller than half, of the clock cycle $T_S$ of the test clock signals TESTCLK 1 and TESTCLK 2.

As a result, the scan clock signal SCANCLK in the capture mode has a waveform of a clock cycle $T_C = T_S/4$ and a clock pulse width $T_W/2 = T_S/8$. The clock cycle is ¼ of that of the test clock signals TESTCLK 1 and 2, thus being a high speed clock signal with 4 times higher frequency.

A process for scan test on the scan chain 1 when inputting the scan clock signal SCANCLK into the F/Fs 101 to 104 shown in FIG. 3 is described herein.

During the shift mode shown in FIG. 3, the scan enable signal SE is set to H level in the selectors 201 to 204, and the high speed clock signal generation unit 300 supplies the pulses $T_6$ and $T_7$ shown in FIG. 3 sequentially to the F/Fs 101 to 104.

At the timings of the rising clock edges $T_{6a}$ and $T_{7a}$ of the pulses $T_6$ and $T_7$ of the scan clock signal SCANCLK, test data is serially and sequentially supplied to the F/Fs 101 and 102 through the selectors 201 and 202, respectively. Upon input of the test data to the F/F 102 at the timing of the rising clock edge $T_{7a}$ of the pulse $T_7$, the input of the test data to the F/Fs 101 and 102 completes.

Then, if the scan enable signal SE is switched from H level to L level, it enters the capture mode. During the capture mode, the scan enable signal SE is set to L level in the selectors 201 to 204, and the high speed clock signal generation unit 300 supplies the pulses $T_A$ and $T_B$ shown in FIG. 3 sequentially to the F/Fs 101 to 104.

By using the timing of the rising clock edge $T_{Aa}$ of the first pulse $T_A$ of the scan clock signal SCANCLK during the capture mode as a launch clock signal LAUNCH CLK, test data is sent in parallel from the F/Fs 101 and 102, which serve as a first register, to the internal circuit 500.

Then, by using the timing of the rising clock edge $T_{Ba}$ of the second pulse $T_B$ of the scan clock signal SCANCLK during the capture mode as a capture clock signal CAPTURE CLK, the data in the internal circuit 500 is captured in parallel to the F/Fs 103 and 104, which serve as a second register.

If the cycle of the pulses $T_A$ and $T_B$ is $T_C$, $T_C=T_S/4$, which is reduced to ¼ compared to the test clock signals TESTCLK 1 and TESTCLK 2. Thus, the frequency of the scan clock signal SCANCLK during the capture mode is 4 times higher than the frequency of the test clock signals TESTCLK 1 and 2, being a high speed signal. For example, if the frequency of the test clock signals TESTCLK 1 and 2 is 100 Hz, the frequency of the scan clock signal SCANCLK during the capture mode is 400 Hz.

The technique taught by Kitaguchi et al. can only increase the frequency of a scan clock signal to at most two times the frequency of a test clock signal supplied from a tester unit. Further, use of a multiply PLL to achieve a high speed clock generally causes an increase in the costs of a semiconductor apparatus due to its large area. The configuration of this embodiment, on the other hand, enables to generate a scan clock signal at a frequency more than two times the frequency of a test clock signal supplied from a tester unit. It also enables to reduce the pulse width of a scan clock signal to smaller than half of that of the test clock signal. Furthermore, it enables to form a semiconductor apparatus without requiring a large area for the high-speed clock signal generation unit 300. It is thus possible to generate a clock signal at a high frequency suitable for scan test on an internal circuit of a semiconductor apparatus with a small scale circuit.

Then, if the scan enable signal SE is switched from L level to H level, it enters the shift mode. During the shift mode, the scan enable signal SE is set to H level in the selectors 201 to 204, and the high speed clock signal generation unit 300 supplies the pulses $T_8$ and $T_9$ shown in FIG. 3 sequentially to the F/Fs 101 to 104. At the timings of the rising clock edges $T_{8a}$ and $T_{9a}$ of the pulses $T_8$ and $T_9$ of the scan clock signal SCANCLK, the data captured in the F/Fs 103 and 104 is sequentially shifted and eventually output to the scan out SOT.

The test data sent to the scan out SOT is then compared with expected value data that is expected to be obtained, thereby determining if the internal circuit 500 operates normally.

Though it is set so that the input, output, launch and capture of test data is performed at the timings of the rising clock edges of the pulses $T_6$, $T_7$, $T_A$, $T_B$, $T_8$ and $T_9$ of the scan clock signal SCANCLK, they may be performed at the timings of the falling clock edges of the pulses $T_6$, $T_7$, $T_A$, $T_B$, $T_8$ and $T_9$ of the scan clock signal SCANCLK.

As described above, this embodiment uses the high speed clock signal generation unit 300 that generates a launch clock signal LAUNCH CLK $T_A$ for sending data to the internal circuit 500 and a capture clock signal CAPTURE CLK $T_B$ for capturing data from the internal circuit 500. The launch clock signal LAUNCH CLK $T_A$ and the capture clock signal CAPTURE CLK $T_B$ are generated based on a plurality of clock signals TESTCLK 1 and 2 having different phases. The pulse width $T_W$ of the plurality of clock signals TESTCLK 1 and 2 is smaller than half of the cycle $T_S$ of the plurality of clock signals TESTCLK 1 and 2. It is thereby possible to generate a clock signal at a high frequency that is suitable for scan test on an internal circuit of a semiconductor apparatus easily with a small scale circuit without using a large scale circuit such as a multiply PLL.

Though a tester unit outputs both test clock signals TESTCLK 1 and 2 in the above description, it is feasible to place a circuit for generating a test clock signal TESTCLK 2 by changing the phase of a test clock signal TESTCLK 1 in a semiconductor apparatus.

Second Embodiment

The configuration of a scan chain that is incorporated into a semiconductor apparatus according to a second embodiment of the present invention is described hereinafter with reference to the drawings.

The second embodiment is different from the first embodiment only in the internal configuration of the high speed clock signal generation unit 300 shown in FIG. 1.

Figure 4:
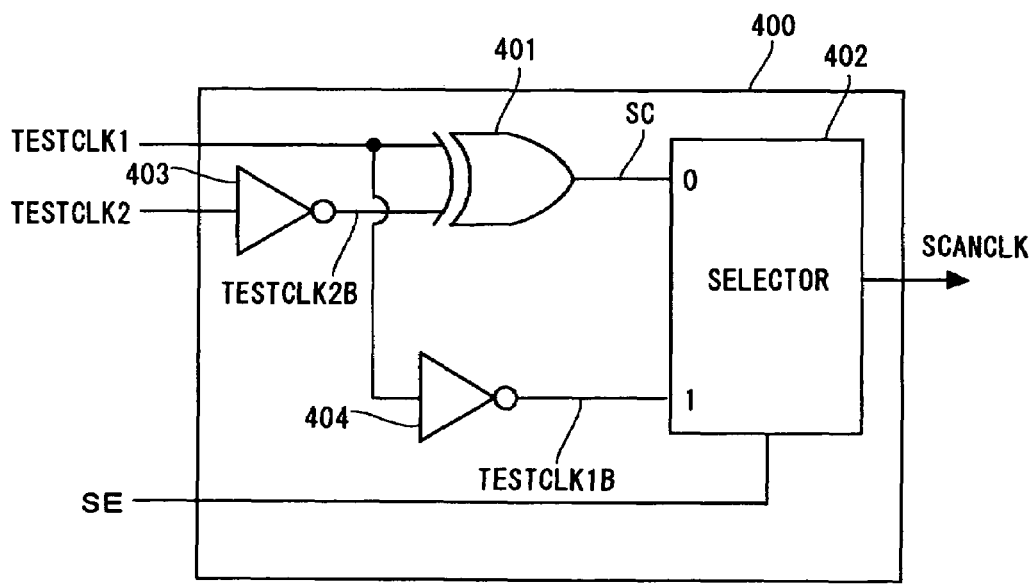
FIG. 4 is a view showing the internal configuration of a high speed clock signal generation unit according to a second embodiment of the present invention.

FIG. 4 is a view showing the internal configuration of a high speed clock signal generation unit 400 according to the second embodiment of the present invention.

The high speed clock signal generation unit 400 is composed of a combination of a plurality of logic circuits and a selector. It includes an EX-OR circuit 401, a selector 402, and inverters 403 and 404.

TESTCLK 1 and 2 are test clock signals that are output from a tester unit (not shown). TESTCLK 1 and 2 have different phases from each other.

The input terminal of the inverter 403 receives a test clock signal TESTCLK 2, and the output terminal of the inverter 403 is connected to the input terminal of the EX-OR circuit 401. The inverter 403 inverts the test clock signal TESTCLK 2 from a tester unit (not shown) and supplies the inverted clock signal to the EX-OR circuit 401.

The input terminal of the inverter 404 receives a test clock signal TESTCLK 1, and the output terminal of the inverter 404 is connected to the input terminal "1" of the selector 402.

The inverter 404 inverts the test clock signal TESTCLK 1 from a tester unit (not shown) and supplies the inverted clock signal to the input terminal "1" of the selector 402.

One input terminal of the EX-OR circuit 401 receives the test clock signal TESTCLK 1, and the other input terminal is connected to the output terminal of the inverter 403. The output terminal of the EX-OR circuit 401 is connected to the input terminal "0" of the selector 402.

The EX-OR circuit 401 implements logical EXCLUSIVE-OR operation on an output signal TESTCLK 2B from the inverter 403 and the test clock signal TESTCLK 1 from a tester unit (not shown). The EX-OR circuit 401 then outputs an output signal SC to the input terminal "0" of the selector 402.

The selector 402 has two input terminals, one output terminal, and an input terminal of a scan enable signal SE. The input terminals of the selector 402 are a terminal "0" and a terminal "1". The output terminal of the selector 402 is connected to the clock input terminals C of the F/Fs 101 to 104.

When the scan enable signal SE is H level, which is in the shift mode, the selector 402 selects the output signal TESTCLK 1B from the inverter 404 that is input to the input terminal "1" and supplies it as a scan clock signal SCANCLK to the F/Fs 101 to 104.

On the other hand, when the scan enable signal SE is L level, which is in the capture mode, the selector 402 selects the output signal SC from the EX-OR circuit 401 that is input to the input terminal "0" and supplies it as a scan clock signal SCANCLK to the F/Fs 101 to 104.

Each signal of the high speed clock signal generation unit 400 according to the second embodiment of the present invention is described herein with reference to the drawings.

Figure 5:
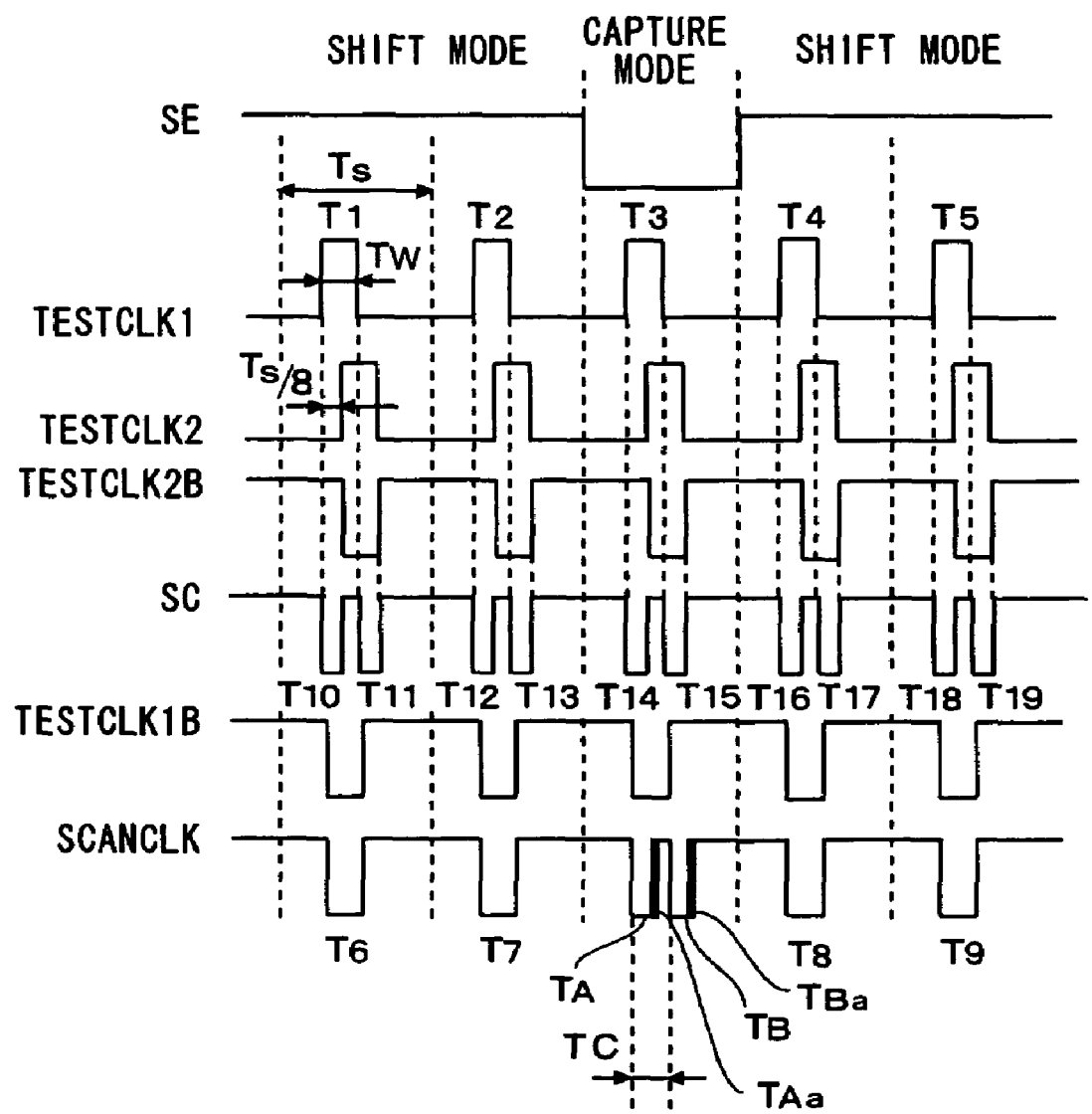
FIG. 5 is a view showing a timing chart of each signal in the high speed clock signal generation unit according to the second embodiment of the present invention.

FIG. 5 is a timing chart of each signal of the high speed clock signal generation unit 400 according to the second embodiment.

FIG. 5 shows a scan enable signal SE, test clock signals TESTCLK 1 and TESTCLK 2, an output signal TESTCLK 2B from the inverter 403, an output signal SC from the EX-OR circuit 401, an output signal TESTCLK 1B from the inverter 404 and a scan clock signal SCANCLK.

A process to generate a scan clock signal SCANCLK in the high speed clock signal generation unit 400 shown in FIG. 4 is described herein.

The test clock signals TESTCLK 1 and 2 that are output from a tester unit (not shown) has a clock cycle $T_S$, a clock pulse width $T_W=T_S/4$, and a duty ratio 25%, for example. The test clock signal TESTCLK 2 is input with a delay of $T_S/8$ with respect to the test clock signal TESTCLK 1.

The output signal TESTCLK 2B from the inverter 403 is an inverted signal of the test clock signal TESTCLK 2.

The output signal TESTCLK 1B from the inverter 404 is an inverted signal of the test clock signal TESTCLK 1.

The pulses $T_{10}$, $T_{12}$, $T_{14}$, $T_{16}$, and $T_{18}$, of the output signal SC from the EX-OR circuit 401 are rectangular wave pulses that fall at the same time as the rise of the pulses $T_1$, $T_2$, $T_3$, $T_4$, and $T_5$ of the test clock signal TESTCLK 1, respectively, and rises after $T_W/2=T_S/8$ from the fall.

The pulses $T_{11}$, $T_{13}$, $T_{15}$, $T_{17}$, and $T_{19}$ of the output signal SC from the EX-OR circuit 401 are rectangular wave pulses that fall after $T_S/8$ from the rise of the pulses $T_{10}$, $T_{12}$, $T_{14}$, $T_{16}$, and $T_{18}$, respectively, and rises after $T_S/8$ from the fall.

The scan clock signal SCANCLK is the same signal as the output signal TESTCLK 1B from the inverter 404 in the shift mode, and the same signal as the output signal SC from the EX-OR circuit 401 in the capture mode. The scan clock signal SCANCLK has the same waveform as the scan clock signal SCANCLK shown in FIG. 3.

Thus, in the shift mode, the scan clock signal SCANCLK has a waveform of a clock cycle $T_S$, and a clock pulse width $T_W=3*T_S/4$ as shown in FIG. 5.

In the capture mode, on the other hand, the scan clock signal SCANCLK has a waveform of a clock cycle $T_C=T_S/4$, and a clock pulse width $T_W/2=T_S/8$.

As shown in FIG. 5, the high speed clock signal generation unit 400 of the second embodiment of the invention sets the pulse width $T_W$ of the test clock signals TESTCLK 1 and TESTCLK 2 to ¼, which is smaller than half of the clock cycle $T_S$ of the test clock signals TESTCLK 1 and TESTCLK 2.

As a result, the scan clock signal SCANCLK in the scan mode has a waveform of a clock cycle $T_C=T_S/4$, and a clock pulse width $T_W/2=T_S/8$. The clock cycle is ¼ of that of the test clock signals TESTCLK 1 and 2, thus being a high speed clock signal with 4 times higher frequency.

The process for scan test on the scan chain 1 when inputting the scan clock signal SCANCLK shown in FIG. 5 into the F/Fs 101 to 104 is the same as the process for scan test on the scan chain 1 when inputting the scan clock signal SCANCLK shown in FIG. 3 into the F/Fs 101 to 104.

Thus, the above configuration allows generating a clock signal at a high frequency that is suitable for scan test on an internal circuit of a semiconductor apparatus easily with a small scale circuit just like the semiconductor apparatus of the first embodiment.

It is apparent that the present invention is not limited to the above embodiment that may be modified and changed without departing from the scope and spirit of the invention.

What is claimed is:

1. A semiconductor apparatus for generating a scan clock signal on an internal circuit of the semiconductor apparatus, comprising:
    a scan chain performing input and output of data in the internal circuit;
    a clock generator generating a launch clock signal for sending data to the internal circuit and a capture clock signal for capturing data from the internal circuit,
    wherein the launch clock signal and the capture clock signal are generated based on a plurality of clock signals, received by the clock generator, having different phases, and
    wherein a pulse width of the plurality of clock signals, received by the clock generator, is smaller than half of a cycle of the plurality of clock signals.

2. The semiconductor apparatus according to claim 1, wherein the launch clock signal and the capture clock signal are obtained by a logic operation on the plurality of clock signals and a scan enable signal for switching between shift mode and capture mode of the scan chain.

3. The semiconductor apparatus according to claim 1, wherein the launch clock signal and the capture clock signal are obtained by a logic operation on the plurality of clock signals and a scan enable signal for switching between shift mode and capture mode of the scan chain, and the logic operation includes exclusive-OR operation.

4. The semiconductor apparatus according to claim 1, wherein the clock generator comprises at least one inverter and an exclusive-OR circuit.

5. The semiconductor apparatus according to claim 4, wherein only one of the plurality of clock signals is directly connected to the exclusive-OR circuit.

6. The semiconductor apparatus according to claim 4, wherein only one of the plurality of clock signals is directly connected to the inverter.

7. The semiconductor apparatus according to claim 1, wherein the clock generator includes an OR circuit, an exclusive-OR circuit, and an inverter.

8. The semiconductor apparatus according to claim 7, wherein the inverter inverts only one of the input test clock signal and outputs the inverted clock signal to the OR circuit.

9. The semiconductor apparatus according to claim 7, wherein the first input terminal of the OR circuit is connected to the output terminal of the inverter, and the second input terminal of the OR circuit receives a scan enable signal.

10. The semiconductor apparatus according to claim 7, wherein the output terminal of the OR circuit is connected to the input terminal of the exclusive-OR circuit.

11. The semiconductor apparatus according to claim 7, wherein the first input terminal of the exclusive-OR circuit receives one of the plurality clock signals and the second input terminal of the exclusive-OR circuit is connected to the output terminal of the OR circuit.

12. The semiconductor apparatus according to claim 1, wherein the clock generator includes a selector, an exclusive-OR circuit, a first inverter, and a second inverter.

13. The semiconductor apparatus according to claim 12, wherein the input terminal of the first inverter receives one of the plurality of clock signals and the output terminal of the first inverter is connected to the input terminal of the exclusive-OR circuit.

14. The semiconductor apparatus according to claim 12, wherein the input terminal of the second inverter receives one of the plurality of clock signals and the output terminal of the second inverter is connected to the input terminal of the selector.

15. The semiconductor apparatus according to claim 12, wherein the first input terminal of the exclusive-OR circuit receives one of the plurality of clock signals and the second input terminal of the exclusive-OR circuit is connected to the output terminal of the first inverter.

16. The semiconductor apparatus according to claim 1, wherein the clock generator sets the pulse width of the plurality of clock signals to approximately ¼ of the plurality of clock cycle of the clock signals.

17. The semiconductor apparatus according to claim 1, wherein the semiconductor apparatus generates the scan clock signal at a frequency more than the frequency of a test clock signal supplied to the clock generator from a tester unit.

18. The semiconductor apparatus according to claim 1, wherein the scan clock signal is generated at a frequency more than two times the frequency of a test clock signal supplied to the clock generator from a tester unit.

19. A digital circuit comprising:
a scan chain performing input and output of data in an internal circuit;
a clock generator generating a launch clock signal for sending data to the internal circuit and a capture clock signal for capturing data from the internal circuit,
wherein the launch clock signal and the capture clock signal are generated based on a plurality of clock signals, received by the clock generator, having different phases, and
wherein the digital circuit generates a scan clock signal at a frequency more than two times the frequency of a test clock signal supplied to the high speed clock generator from a tester unit.

20. A digital circuit comprising:
a scan chain performing input and output of data in an internal circuit;
a clock generator generating a launch clock signal for sending data to the internal circuit and a capture clock signal for capturing data from the internal circuit,
wherein the launch clock signal and the capture clock signal are generated based on a plurality of clock signals, received by the clock generator, having different phases,
wherein a pulse width of the plurality of clock signals is smaller than half of a cycle of the plurality of clock signals, received by the clock generator, and
wherein the clock generator comprises at least one inverter and an exclusive-OR circuit.

* * * * *